United States Patent
Horng et al.

(10) Patent No.: US 7,479,394 B2
(45) Date of Patent: Jan. 20, 2009

(54) MGO/NIFE MTJ FOR HIGH PERFORMANCE MRAM APPLICATION

(75) Inventors: Cheng T. Horng, San Jose, CA (US); Ru-Ying Tong, Los Gatos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 454 days.

(21) Appl. No.: 11/317,388

(22) Filed: Dec. 22, 2005

(65) Prior Publication Data

US 2007/0148786 A1 Jun. 28, 2007

(51) Int. Cl.
*H01L 21/00* (2006.01)
*H01L 21/8246* (2006.01)

(52) U.S. Cl. .................. 438/3; 438/3; 438/652; 438/658; 438/665; 257/E21.665

(58) Field of Classification Search .............. 438/3, 438/652, 658, 665; 257/E21.665
See application file for complete search history.

(56) References Cited

U.S. PATENT DOCUMENTS

| | | | |
|---|---|---|---|
| 6,347,049 B1 | 2/2002 | Childress et al. | 365/173 |
| 6,737,691 B2 | 5/2004 | Asao | 257/295 |
| 6,828,260 B2 | 12/2004 | Sharma et al. | 438/795 |
| 6,841,395 B2 | 1/2005 | Linn et al. | 438/3 |
| 2007/0111332 A1* | 5/2007 | Zhao et al. | 438/3 |

OTHER PUBLICATIONS

Co-pending U.S. Appl. No. 11/280,523, filed Nov. 16, 2005, Assigned to the same assigner as present invention, "Low Resistance Tunneling Magnetoresistive Sensor with Natural Oxidized Double Mgo Barrier".
"Exchange-biased magnetic tunnel junctions and application to non-volatile magnetic random access memory (invited).", by S. S. Parkin et al., Jrnl. of App.l. Phys. vol. 85, No. 8, Ap. 15, 19 99, pp. 5808-5833.
"Progress and Outlook for MRAM Technology", by. S. Tehrani et al., IEEE Trans. on Mac. vol. 35, No. 5, Sep. 1999, pp. 2814-2819.
"A High-Speed 128 Kbit MRAM Core for Future Universal Memory Applications", by A. Bette et al., 2003 Symp. on VLSI Cir. Dig. of Tech. Papers 4-89114-035-6/03.
"Giant room-temperature magnetoresistance in single-crystal Fe/Mgo/Fe magnetic tunnel junctions", by Shinji Ynasa et al., 2004 Nature Publishing Group, pp. 1-4.
"Giant Tunneling Magnetoresistance at Room Temperature with MgO (100) Tunnel Barriers", by Stuart S. P. Parkin et al., Nat. Mater. 3, p. 868, 2004 Nature Publishing Group, pp. 1-6.

(Continued)

*Primary Examiner*—Thanh V Pham
(74) *Attorney, Agent, or Firm*—Saile Ackerman LLC; Stephen B. Ackerman

(57) ABSTRACT

An improved tunneling barrier layer is formed for use in a MTJ device. This is accomplished by forming the tunneling barrier layer in two steps. First a layer of magnesium is deposited by DC sputtering and converted to magnesium oxide through radical oxidation. This is followed by a second, thinner, magnesium layer that is converted to magnesium oxide through normal oxidation. Optionally, there may also be a thin layer of magnesium on the two magnesium oxide layers.

23 Claims, 2 Drawing Sheets

OTHER PUBLICATIONS

"TMR Device with World Best Performance Fabricated by Mass Manufacturing System", pp. 1-7, Latest Research, Jul. 13, 2005, avail. on line at: http://www.aist.ao.ip/aist_e/latest_research/2004/20040907/20040907.html.

"Spin-dependent tunneling conductance of Fe/MgO/Fe sandwiches", by W. H. Butter et al., 2001 The American Physical Society, Phys. Review B, vol. 63, 054416, pp. 1-12.

* cited by examiner

MGO/NIFE MTJ FOR HIGH PERFORMANCE MRAM APPLICATION

Related application HT05-045 (file no. 11/280,523 filed on Nov. 16, 2005) discloses a different type of MgO barrier layer and is herein incorporated, by reference, in its entirety.

FIELD OF THE INVENTION

The invention relates to the general field of magnetic tunnel junctions with particular reference to an improved tunneling barrier layer.

BACKGROUND OF THE INVENTION

Magnetoresistive Random Access Memory (MRAM), based on the integration of silicon CMOS with Magnetic Tunnel Junctions (MTJ), is a major emerging technology (1, 2), highly competitive with existing semiconductor memories (SRAM, DRAM, Flash etc). The key element of MRAM technology is the MTJ element. The MTJ consists of two ferromagnetic layers (free layer and pinned layer) separated by a thin tunnel barrier layer. Magnetization of the two ferromagnetic layers can be arranged in either parallel (low resistance) or anti-parallel (high resistance) magnetization states to, respectively, represent "1" and "0" memory states. In MRAM array cells, information is stored in the MTJ's free layer.

The MTJ memory cells are inserted at the back end of a CMOS process. The high-speed version of MRAM architecture consists of a cell with an access transistor and a MTJ (1T1MTJ) applying currents to orthogonal conductor lines. The conductors are arranged in a cross-point architecture that provides the field needed for selectively switching each bit. The intersection of the lines generates a peak field that is engineered to be just over the switching threshold of that MTJ.

The generic MTJ structure is schematically illustrated in FIG. 1. Seen there is bottom conductor 21, seed layer 22, AFM pinning layer 23, pinned ferromagnetic layer 24, tunneling barrier layer 25, free ferromagnetic layer 26, and capping layer 27. The three most critical layers in the MTJ stack are (a) pinned layer, (b) tunneling barrier layer, and (c) free layer.

In most MTJ devices the pinned layer is a synthetic antiferromagnetic trilayer (e.g. CoFe/Ru/CoFe) that serves to reduce the offset field applied to the free layer. The tunneling barrier layer most widely used at present is an aluminum oxide (AlOx) layer formed by first depositing a 7-12 Å thick Al film, which is subsequently oxidized, in-situ, by various means. The MTJ's free layer is best made of a thin permalloy (NiFe) film, selected for its reproducible and reliable switching characteristics—low switching field (Hc) and good switching field uniformity ($\sigma$Hc). The intrinsic dR/R that is obtainable for a NiFe-MTJ is, at best, around 40% for a R.A value (resistance.area product) between 1,000 to 10,000 ohm-$\mu m^2$.

We note here that present 1 Mbit MRAM chips are designed as arrays of 0.3×0.6 $\mu m^2$ bit size MTJ elements that are capable of delivering dR/R=40% and RA =1000-2000 ohm-$\mu m^2$. The MTJ during a read operation is biased at 300-400 mv. At this bias voltage, the effective dR/R is around 25%.

For even higher density MRAM chips (e.g. 250 Mbits), MTJ bit size would be reduced to less than 0.2×0.4 $\mu m^2$. For the next generation MRAM, it is required to have MTJ elements capable of delivering much higher dR/R (>>40%) with lower MTJ resistance (e.g. R.A=500 ohm-$\mu m^2$) to improve read access time (3).

It has been shown that MTJs made with a monocrystalline MgO barrier layer and a CoFe(B) free layer are capable of a very high dR/R of more than 200% (4-6). Such a huge dR/R is the result of coherent tunneling (7) in which the electron symmetry of the ferromagnetic electrode is preserved during tunneling through the crystalline MgO barrier. In reference (5), strongly 001 oriented MgO is formed on top of the crystalline oriented CoFe pinned layer (AP1).

The MgO was formed by reactive sputtering of a Mg target in a Ar/$O_2$ gas mixture R.A for these MgO MTJs was greater than 10,000 ohm-$\mu m^2$. The MgO-MTJ described in reference (6) is made in the Anelva C-7100 sputtering system. Highly oriented (001) MgO is also formed on top of an amorphous CoFeB pinned layer (AP1), a R.A of 460 ohm-$\mu m^2$ being reported. Some typical data relating to structures of this type* are summarized in TABLE I below:

TABLE I

Magnetic performance of an MgO-MTJ formed in an Anelva C-7 100 sputtering system.

| FL | Capping | R.A | MR | Bs | Hc | Hin | Hk |
|---|---|---|---|---|---|---|---|
| CoFeB30 | Ta80/Ru100 | 1709 | 214 | 0.33 | 9.93 | 1.76 | 34.6 |
| NiFe40 | Ru30/Ta30/Ru100 | 2130 | 43.5 | 0.29 | 1.63 | 4.5 | 9.5 |
| CoFeB30 | Ta80/Ru100 | 744 | 219 | 0.25 | 8.21 | −0.77 | 38 |
| NiFe35 | Ru30/Ta30/Ru100 | 1228 | 46.0 | 0.24 | 1.70 | 4.14 | 8.8 |

FL = free layer; MR in %, Hk, Hin, and Hc in Oe;

The specific structure was:
Ta50/CuN200/Ta30/MP150/CoFe(30%)25/Ru8.5/CoFeB30/MgO18/FL/Capping (360° C.-2hrs−10K Oe).

It is important to note that in this case of a CoFeB/MgO/NiFe MTJ, the crystalline MgO tunnel barrier, formed by RF-sputtering from an MgO target, does not match well with the NiFe free layer.

REFERENCES:

1. S. S. Parkin et.al. "Exchange-based magnetic tunnel junctions and application to nonvolatile MRAM", J. Appl. Phys. Vol 85, pp 5828-5833 (1999).
2. S. Tehrani et. al. "Progress and Outlook for MRAM Technology", IEEE Trans. on Magn. Vol 35, pp 2814-2819 (1999).
3. A Bette et. al. "A high speed 128-kb MRAM core for future universal memory application". 2003 Symposium on VLSI Circuits Digest 4-89114-035-6/03

4. S. Yuasa et al. "Giant room-temperature MR in single-crystal Fe/MgO/Fe MTJ", Nat. Mater. 3, p 868 (2004)
5. S. Parkin et. al. "Giant tunneling MR at room temperature with MgO(100) tunnel barrier layer", Nat. Mater. 3 p. 862 (2004).
6. "TMR device with world best performance fabricated by mass manufacturing system", Latest Research, Jul. 13, 2005; available on line at:
   http://www.aist.go.jp/aist_e/latest_research/2004/20040907/20040907.html
7. W. H. Butler et. al. "Spin-dependent tunnel conductance of Fe/MgO/Fe sandwiches", Phys. Review B, vol 63, 054416 (2001) 12 pages.

A routine search of the prior art was performed with the following additional references of interest being found:

In U.S. Pat. No. 6,841,395, Linn et al. disclose a tunnel barrier layer formed by depositing Mg, then depositing MgO and oxidizing the film. A CoFe/NiFe free layer was used. U.S. Pat. No. 6,828,260 (Sharma et al.) teaches that MgO is a typical tunneling barrier layer and that there is no need for oxidation. Asao, in U.S. Pat. No. 6,737,691, shows that the tunneling barrier layer can be MgO which is preferred to be 10 nm or less thick U.S. Pat. No. 6,347,049 (Childress et al) describes a trilayer tunneling barrier of MgO/AlO/MgO. The Mg and Al are deposited and oxidized, then the second layer of Mg is deposited and oxidized.

SUMMARY OF THE INVENTION

It has been an object of at least one embodiment of the present invention to provide a tunneling barrier layer that, when used as part of a MTJ element, has both a very high dR/R as well as a low R.A product.

Another object of at least one embodiment of the present invention has been to provide a process for forming said tunneling barrier layer.

Still another object of at least one embodiment of the present invention has been that said MTJ element include a NiFe free layer in order to minimize magnetostriction ($\lambda$s), switching field Hc, and switching field uniformity $\sigma$Hc.

A further object of at least one embodiment of the present invention has been that said MTJ structure have a dR/R greater than 60% together with an R.A value less than about 1,000 ohm. $\mu m^2$ and an interlayer coupling field (Hin) less than 4 Oe.

These objects have been achieved by forming the tunneling barrier layer in up to three steps. First a layer of magnesium is deposited by DC magnetron sputtering and converted to magnesium oxide through radical oxidation. This is followed by a second, thinner, magnesium layer that is converted to magnesium oxide through normal oxidation. This, in turn, is followed by a third magnesium layer that need not be oxidized. When used as part of an MTJ structure, the resulting memory element has both high dr/r as well as low R.A.

DESCRIPTION OF THE PREFERRED EMBODIMENTS

Figure 1:
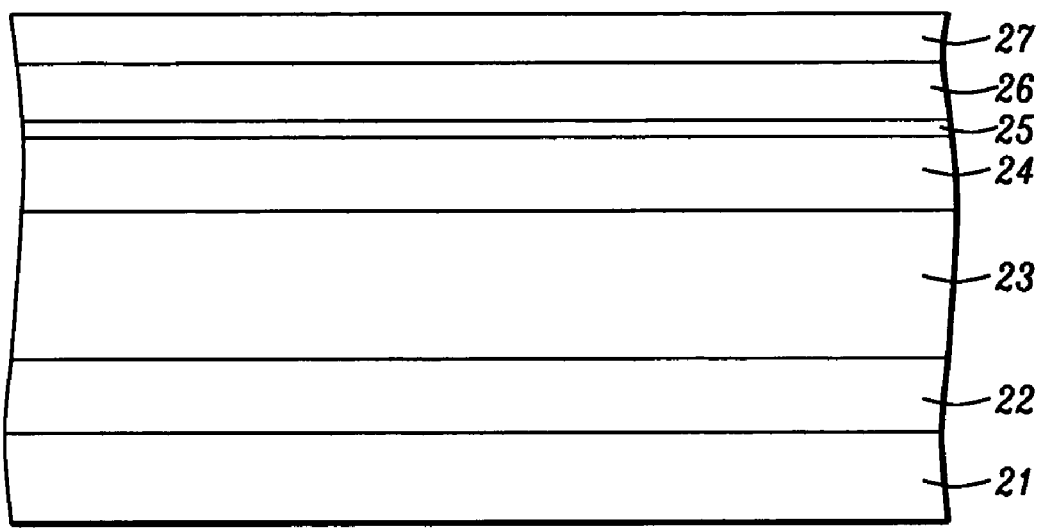
FIG. 1 is a schematic cross-section of an MTJ device of the prior art.
Figure 2:
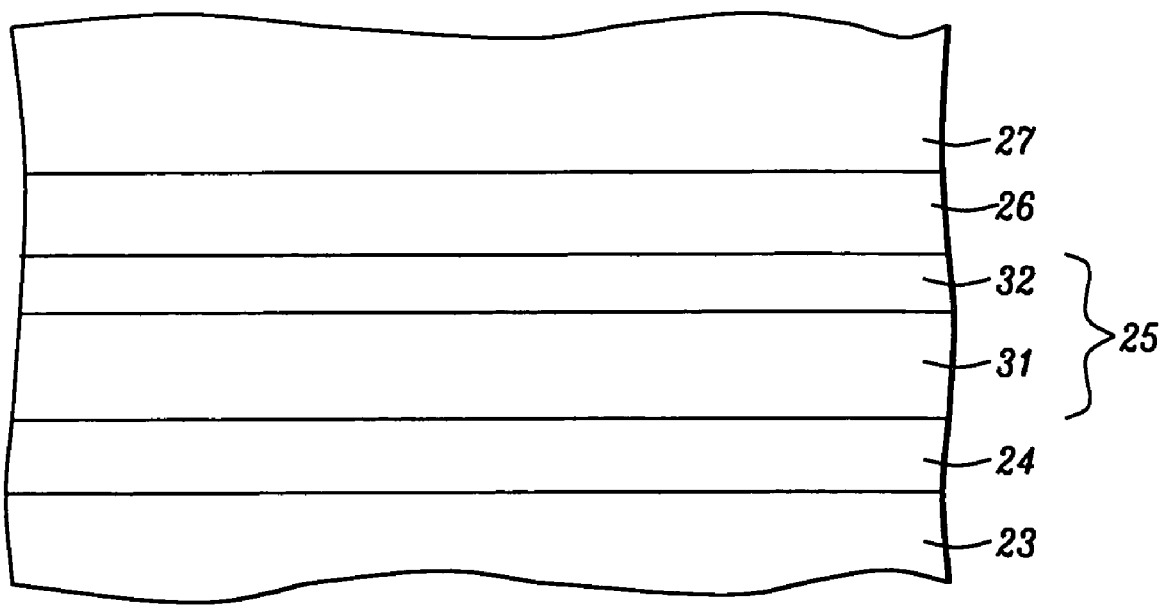
FIG. 2 is a schematic cross-section of an MTJ device in which the tunneling barrier layer has been modified according to the teachings of the present invention.
Figure 3:
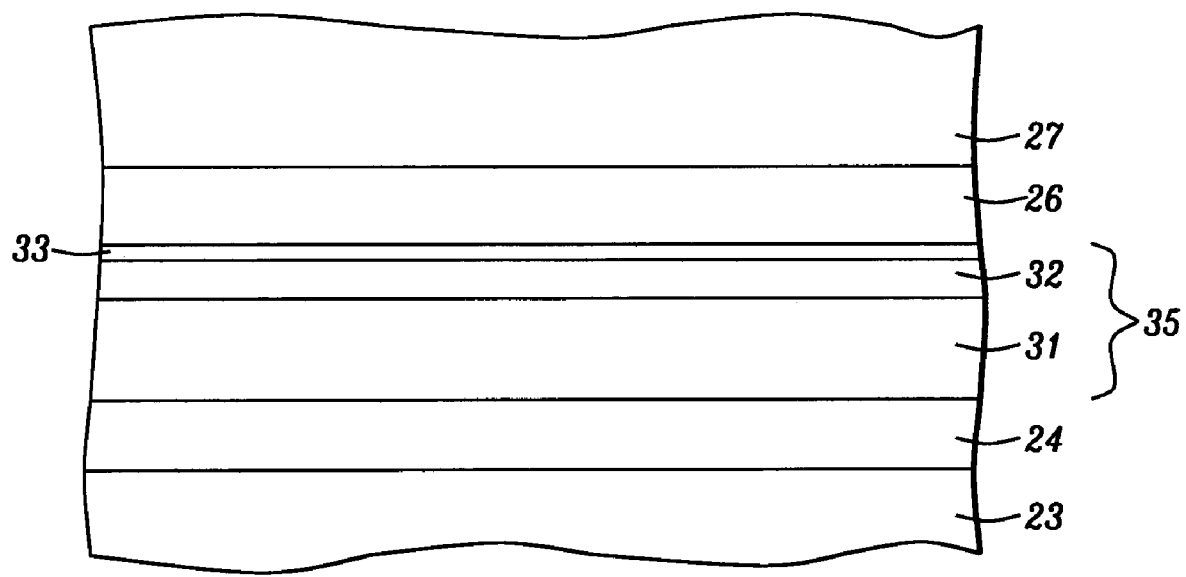
FIG. 3 shows a slight variation as an alternative to FIG. 2.

Referring now to FIG. 2, in the present invention the MgO barrier layer is formed by first sputter depositing a Mg film to a certain thickness (typically between about 10 and 13 Angstroms), and then oxidizing it using a ROX (radical oxygen) process. This is followed by the deposition of a second (thinner) layer of magnesium (to a thickness between about 3 and 4 Angstroms) that is then oxidized using natural oxidation (NOX). FIG. 2 illustrates how the conventional barrier layer 25 of FIG. 1 has been replaced by ROX-formed layer 31 and NOX-formed layer 32. FIG. 3 shows a variation of FIG. 2 wherein bilayer 25 of FIG. 2 has been replaced by trilayer 35. The latter consists of the two magnesium oxide layers 31 and 32 plus an additional layer 33 of unoxidized magnesium.

A critical feature of the present invention is that the magnesium layers are deposited by means of DC sputtering. It is important to distinguish this from RF sputtering commonly used to deposit from a (dielectric) MgO target. Our use of DC sputtering of a (metallic) Mg target results in a uniform Mg film, which is particulate free.

The ROX process used by the present invention involves placing a grid-like 'shower cap' between an upper ionizing electrode and the substrate (in this case Mg) inside an oxidation chamber. A shower of oxygen radicals is generated by said upper electrode through the application of 300-500 watts of RF power to oxygen flowing by at a rate of 0.3 to 0.5 SLM for a period of about 60 to 200 seconds. Annealing of the structure is done at 360° C. for about 2 hours in a 10 kOe oriented field. In contrast, annealing of the prior art CoFeB/AlOx/NiFe-MTJ structure was done at 280° C. so the thermal stability of the MgO-MTJ is much better than that of an AlOx-MTJ.

The NOX process used as part of the present invention was implemented with oxygen that was passed over the magnesium at a pressure of between about 0.1 and 1 torr at room temperature. The resulting oxide has somewhat less preferred orientation than the lower layer, being closer in structure to an amorphous layer. Our criterion for distinguishing one level of preferred orientation over another has been to compare the relative intensities of the 001 peaks that appear in their respective X-ray diffraction patterns.

The magnetic performance properties of the MgO-MTJ structure formed according to the process of the present invention were measured with a CIPT probe (device for measuring the magnetoresistance of an unpatterned MTJ stack) and a B-H looper, yielding the results summarized in TABLE II below:

TABLE II

Magnetic performance properties of CoFeB/MgO/NiFe MTJs

| Single MgO layer | | NiFe(21%) | | NiFe(17.5%) | | |
|---|---|---|---|---|---|---|
| Mg | ROX(s) | RA | dR/R | RA | dR/R | Hin |
| 11 | 70 | 131 | 63.7 | 121 | 52.9 | 11.1 |
| 12 | 70 | 129 | 60.8 | 121 | 53.7 | 10.8 |
| 13 | 70 | 152 | 60.3 | 117 | 51.8 | 9.54 |

Crystalline MgO formed by the process of the present invention, as displayed by HRTEM (high resolution transmission electron microscopy), is highly (001) oriented. An Mg13 film after oxidation becomes a 15 Å thick MgO layer. See TABLE II. dR/R of the CoFeB/Mg(11-13)/ROX/NiFe(21%) MTJ is greater than 60% and dR/R of the CoFeB/Mg(11-13)/ROX/NiFe(17.5%) MTJ is around 53%.

In CoFeB/AlOx/NiFe(17.5, 21%) MTJ structures, for an R.A between about 1,000 and 2,000 ohm. $\mu m^2$) an MTJ with a NiFe(21%) free layer has displayed higher dR/R and lower H-rate (i.e. kink hysteresis curve) than that of a NiFe(17.5%)

MTJ. R.A of the MgO-MTJ structures, however, is low (<150 ohm-μm$^2$) and R.A is almost independent of the MgO thickness. A stronger ROX process had been applied to oxidize the Mg film but failed to increase the R.A value. This result indicates that ROX is limited to a certain thickness of the Mg layer. Also shown in TABLE II, is Hin, the inter-layer coupling field between the pinned layer and the free layer. For the Mg13/ROX barrier layer this is around 10 Oe. A Hin value of this magnitude is too high to be useful for MRAM applications.

To increase R.A and reduce Hin, an MTJ having a thicker MgO tunneling barrier layer was developed as part of the present invention. This thicker MgO layer consists of two MgO layers, as already described above. Data confirming the advantages of the process of the present invention are presented below in TABLE III:

TABLE III

Magnetic properties of the Mg(x)/ROX/Mg(y)/NOX MTJ with NiFe 17.5% free layer.

| Mg(x) + Mg(y) | ROX/NOX | RA | dR/R | Hin |
|---|---|---|---|---|
| 12 + 4 | 80/0 | 219 | 61.9 | 2.93 |
| 12 + 4 | 100/80 | 460 | 59.1 | 4.50 |
| 12 + 3 | 80/120 | 322 | 63.8 | 5.77 |
| 12 + 5 | 80/120 | 419 | 53.3 | 2.54 |
| 12 + 3 | 100/120 | 428 | 58.8 | 6.34 |
| 12 + 5 | 100/120 | 543 | 54.6 | 2.97 |

ROX and NOX in seconds

As noted in the first row of Table III, dR/R of the 12+4 MTJ, without NOX applied to the top Mg4 layer, is around 62%. Without oxidation of the top Mg film, R.A is around 220 ohm-μm$^2$ With top oxidation (second row), R.A is increased to 460 ohm-μm$^2$ but dR/R is slightly reduced. Also, when top layer NOX is used, Hin is also increased. Over-all results shown in TABLE III indicate that increasing the top Mg thickness results in reducing dR/R.

Since MgO is made in the same way as AlOx, it is expected that R.A controllability should be equivalent to that of AlOx-MTJ. To further enhance dR/R while reducing Hin, trilayer MgO barrier layers were investigated. The results are shown in TABLE IV:

TABLE IV

Magnetic properties of Mg12/ROX(1)/Mg3/ROX(2)/MG3/1

| Mg(x) + Mg(y) + Mg(z) | ROX(x)/ROX(y)/SL | R.A | dR/R | Hc | Hin |
|---|---|---|---|---|---|
| 12 + 3 + 3 | 100/90/15 | 1250 | 68% | 2.35 | 1.74 |
| 12 + 3 + 3 | 100/90/0 | 850 | 69% | 2.20 | 0.63 |

(Free layer + NiFe21%)

Note that inclusion of the third (unoxidized) Mg layer gives higher dR/R and low Hin. With SL oxidation, a higher R.A is obtained.

It is anticipated that further adjustment of the MgO structure/process of the present invention will result in MgO/NiFe MTJs capable of delivering dR/R>60% for a NiFe17.5% MTJ structure, and dR/R>70% for a NiFe21%-MTJ structure. An R.A below 1,000 ohm-μm$^2$ and Hin <1 Oe are also anticipated. It is also noted that the Hc values for the NiFe(21%) free layer in the MgO-MTJ structure are smaller than for the AlOx-MTJ (2.2 Oe vs 2.4 Oe). Thus, CoFeB/MgO/NiFe MTJ structures formed according to the teachings of the present invention will be suitable for high density/high performance MRAM applications.

What is claimed is:

1. A method to form a tunneling barrier layer, comprising:
   by means of D.C. sputtering, depositing a first magnesium layer to a first thickness;
   fully oxidizing said first magnesium layer by means of radical oxidation, thereby forming a first layer of magnesium oxide;
   depositing a second magnesium layer to a second thickness on said first magnesium oxide layer;
   then fully oxidizing said second magnesium layer by means of natural oxidation, thereby forming said tunneling barrier layer; and
   annealing said tunneling barrier layer in a magnetic field having a direction, whereby said first magnesium oxide layer has a preferred 001 crystal orientation.

2. The method described in claim 1 wherein said first thickness is between about 10 and 13 Angstroms.

3. The method described in claim 1 wherein the step of radical oxidation further comprises using an upper electrode to excite oxygen, that flows over it at between about 0.3 and 0.5 SLM, at a power level of between about 400 and 600 watts, and then passing said excited oxygen over said first magnesium layer.

4. The method described in claim 1 wherein said second thickness is between about 3 and 5 Angstroms.

5. The method described in claim 1 wherein the step of natural oxidation further comprises exposing said second magnesium layer to oxygen at a pressure of between about 0.5 and 1 torr for between 1 and 5 minutes.

6. The method described in claim 1 wherein the step of annealing said magnesium oxide layers further comprises heating at a temperature between about 300 and 400° C. for between about 60 and 120 minutes, in a magnetic field of between about 5 and 10 kOe said direction being parallel to an easy axis.

7. The method described in claim 1 wherein said complete tunneling barrier layer is free of all particulate contamination.

8. A method to form a tunneling barrier layer, comprising:
   by means of D.C. sputtering, depositing a first magnesium layer to a first thickness;
   fully oxidizing said first magnesium layer by means of a first radical oxidation, thereby forming a first layer of magnesium oxide;
   depositing a second magnesium layer to a second thickness on said first magnesium oxide layer;
   fully oxidizing said second magnesium layer by means of a second radical oxidation, thereby forming a second layer of magnesium oxide; and
   depositing a third magnesium layer to a third thickness on said second magnesium oxide layer thereby completing formation of said tunneling barrier layer.

9. The method described in claim 8 wherein said first thickness is between about 10 and 13 Angstroms.

10. The method described in claim 8 wherein the step of first radical oxidation further comprises using an upper electrode to excite oxygen, that flows over it at between about 0.3 and 0.5 SLM, at a power level of between about 400 and 600 watts, and then passing said excited oxygen over said first magnesium layer for between about 80 and 150 seconds.

11. The method described in claim 8 wherein said second thickness is between about 3 and 5 Angstroms.

12. The method described in claim 8 wherein the step of second radical oxidation further comprises using an upper electrode to excite oxygen, that flows over it at between about 0.2 and 0.3 SLM, at a power level of between about 200 and 300 watts, and then passing said excited oxygen over said first magnesium layer for between about 80 and 150 seconds.

13. The method described in claim 8 wherein said third thickness is between about 3 and 5 Angstroms.

14. The method described in claim 8 wherein said complete tunneling barrier layer is free of all particulate contamination.

15. A process to manufacture a magnetic tunnel junction memory element, including a tunneling barrier layer, comprising:

provide a seed layer on a lower electrode;
depositing an antiferromagnetic layer on said seed layer;
depositing a pinned layer on said antiferromagnetic layer;
by means of D.C. sputtering, depositing a first magnesium layer, having a first thickness, on said pinned layer;
fully oxidizing said first magnesium layer by means of radical oxidation, thereby forming a first layer of magnesium oxide;
annealing said first magnesium oxide layer in a magnetic field having a direction, whereby said first magnesium oxide layer acquires a preferred 001 crystal orientation;
depositing a second magnesium layer to a second thickness on said first magnesium oxide layer;
then fully oxidizing said second magnesium layer by means of natural oxidation, thereby forming a magnesium oxide tunneling barrier layer having a thickness between about 3 and 5 Angstroms;
depositing a free layer on said tunneling barrier layer; and
depositing a capping layer on said free layer.

16. The process recited in claim 15 wherein said first thickness is between about 11 and 13 Angstroms.

17. The process recited in claim 15 wherein the step of radical oxidation further comprises using an upper electrode to excite oxygen, that flows over it at between about 0.3 and 0.5 SLM, at a power level of between about 400 and 600 watts, and then passing said excited oxygen over said first magnesium layer.

18. The method described in claim 15 wherein said second thickness is between about 3 and 5 Angstroms.

19. The method described in claim 15 wherein the step of natural oxidation further comprises exposing said second magnesium layer to oxygen at a pressure of between about 0.5 and 1 torr for between 1 and 5 minutes.

20. The method described in claim 15 wherein the step of annealing said magnesium oxide layers further comprises heating at a temperature between about 300 and 400° C. for between about 60 and 120 minutes, in a magnetic field of between about 5 and 10 kOe said direction being parallel to an easy axis.

21. The process recited in claim 15 wherein said complete tunneling barrier layer is free of all particulate contamination.

22. The process recited in claim 15 wherein said memory element has a dR/R value of at least 60% and a R.A. product that is no greater than 1,000 ohm. $\mu m^2$.

23. A method to form a tunneling barrier layer, comprising:

by means of D.C. sputtering, depositing a first magnesium layer to a thickness of from about 10 to 13 Angstroms;
fully oxidizing said first magnesium layer by means of radical oxidation, thereby forming a first layer of magnesium oxide;
on said first magnesium oxide layer, depositing a second magnesium layer to a thickness of from about 3 to 5 Angstroms;
then fully oxidizing said second magnesium layer by means of radical oxidation, thereby forming a second layer of magnesium oxide;
on said second magnesium oxide layer, depositing a third magnesium layer to a thickness of from about 3 to 4 Angstroms, thereby completing formation of said tunneling barrier layer; and
annealing said tunneling barrier layer in a magnetic field having a direction, whereby said first magnesium oxide layer has a preferred 001 crystal orientation and said third magnesium layer acts to getter oxygen away from both said second magnesium oxide layer and from a subsequently deposited free layer.

* * * * *